(12) United States Patent
Wert et al.

(10) Patent No.: US 6,281,706 B1
(45) Date of Patent: Aug. 28, 2001

(54) PROGRAMMABLE HIGH SPEED QUIET I/O CELL

(75) Inventors: Joseph D. Wert, Arlington; Dan E. Daugherty, Burleson; Richard L. Duncan, Bedford, all of TX (US)

(73) Assignee: National Semiconductor Corp., Santa Clara, CA (US)

( * ) Notice: Subject to any disclaimer, the term of this patent is extended or adjusted under 35 U.S.C. 154(b) by 0 days.

(21) Appl. No.: 09/052,042

(22) Filed: Mar. 30, 1998

(51) Int. Cl.[7] .............................................. H03K 19/0175
(52) U.S. Cl. ................................ 326/83; 326/83; 326/86; 326/26; 326/27; 326/17; 326/121
(58) Field of Search .................................. 326/83, 86, 26, 326/27, 17, 121

(56) References Cited

U.S. PATENT DOCUMENTS

| | | | |
|---|---|---|---|
| 4,779,013 | 10/1988 | Tanaka | 307/443 |
| 4,825,101 | * 4/1989 | Walters, Jr. | 307/270 |
| 5,315,172 | * 5/1994 | Reddy | 307/443 |
| 5,614,842 | * 3/1997 | Doke et al. | 326/58 |
| 5,617,043 | * 4/1997 | Han et al. | 326/83 |
| 5,889,707 | * 3/1999 | Yang | 365/189.05 |

* cited by examiner

Primary Examiner—Michael Tokar
Assistant Examiner—Vibol Tan
(74) Attorney, Agent, or Firm—Skjerven, Morrill, MacPherson, Franklin & Friel; Edward C. Kwok

(57) ABSTRACT

An output buffer circuit includes multiple programmable boost drive stages which allow selection of one of several drive strengths to accommodate a range of output load conditions, thereby achieving low noise and low power dissipation. In one embodiment, one or more of the boost circuits turn on after the primary driver circuit is turned on, and turn off before the primary circuit is turned off, thereby achieving soft turn-on and turn-off.

13 Claims, 6 Drawing Sheets

US 6,281,706 B1

PROGRAMMABLE HIGH SPEED QUIET I/O CELL

BACKGROUND OF THE INVENTION

1. Field of the Invention

The present invention relates to interface circuits. In particular, the present invention relates to designing low noise programmable output buffers in interface circuits.

2. Discussion of the Related Art

FIG. 1 illustrates a typical communication system 100, which includes a device 110 communicating with a second device 120 over a signal path 130. Device 110 drives onto signal path 130 a data signal, which is received into device 120 by an input buffer 122. Typically, the propagation delay on signal path 130 depends on the drive strength of output buffer 112, the length of signal path 130, and the load on signal path 130 resulting from devices coupled to signal path 130, such as device 120. Typically, increasing the drive strength of output buffer 112 decreases the propagation delay on signal path 130. This technique is used frequently in the prior art (see, e.g., U.S. Pat. No. 4,779,013 to Tanaka).

In many situations, however, output buffer 112 is not specifically designed for use with device 110. Thus, a mismatch can seriously affect the performance of system 100. For instance, if output buffer 112 has a high drive strength but signal path 130 is only lightly loaded, noise can be introduced into device 120 through input buffer 122. FIG. 2 provides an example of a waveform 200 resulting from a overly strong output buffer driving a digital signal onto a lightly loaded signal path. Portion 215 of the waveform 200 represents, in a rising edge transition, the overshoot and brief oscillation ("ringing") resulting from this mismatch. Similar ringing characteristics are exhibited in a falling edge transition in portion 225 of waveform 200. The rapid switching of currents in buffer 112 can also lead to ground bounce and high frequency noises and high power dissipation, all of which are undesirable.

SUMMARY OF THE INVENTION

The present invention provides a multistage output buffer with a stepwise variable output drive strength that is user-programmable to match the load presented in an application and consumes less power and produces less noise than prior art buffers.

The present invention is better understood upon consideration of the detailed description below and the accompanying drawings.

DETAILED DESCRIPTION OF THE PREFERRED EMBODIMENTS

Figure 1:
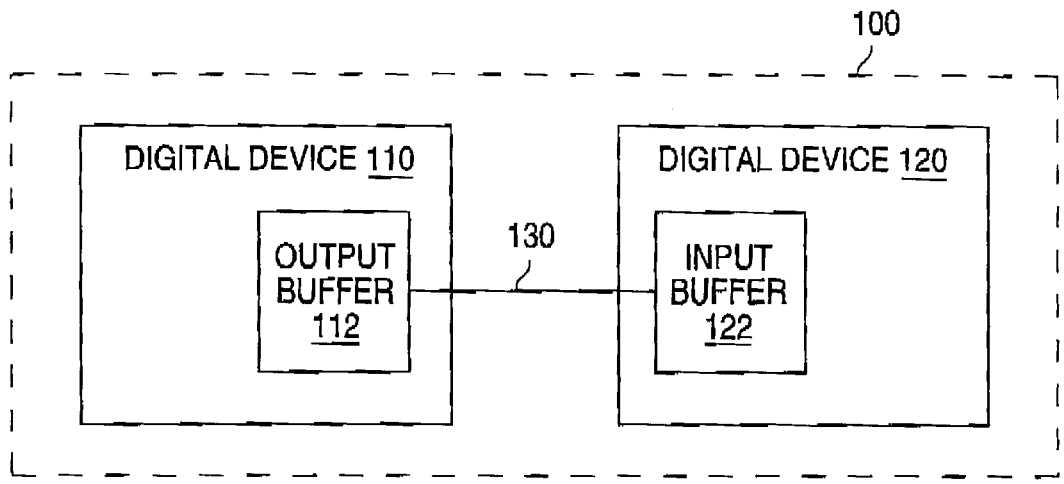
FIG. 1 shows a generalized communication system 100 including devices 110 and 112 communicating over a signal path 130.
Figure 2:
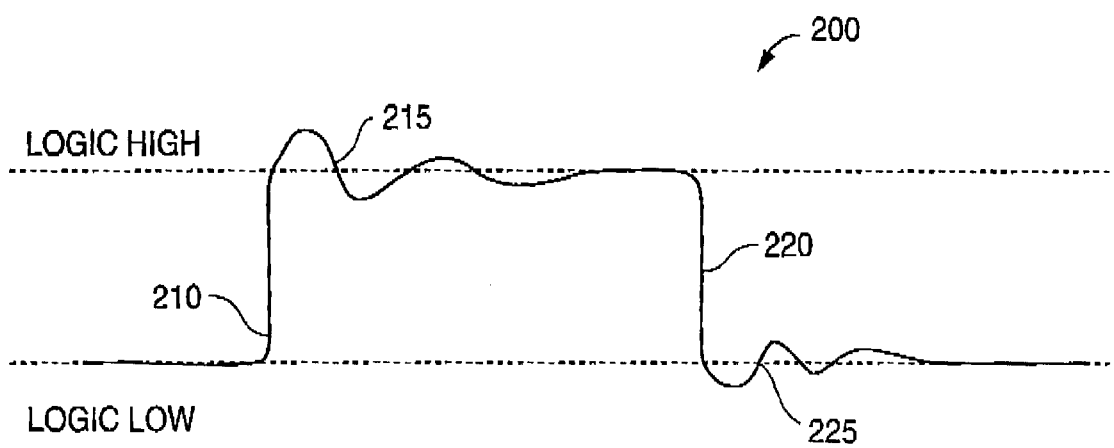
FIG. 2 shows a waveform 200 which exhibits "ringing" resulting from an overly strong output driver.
Figure 3:
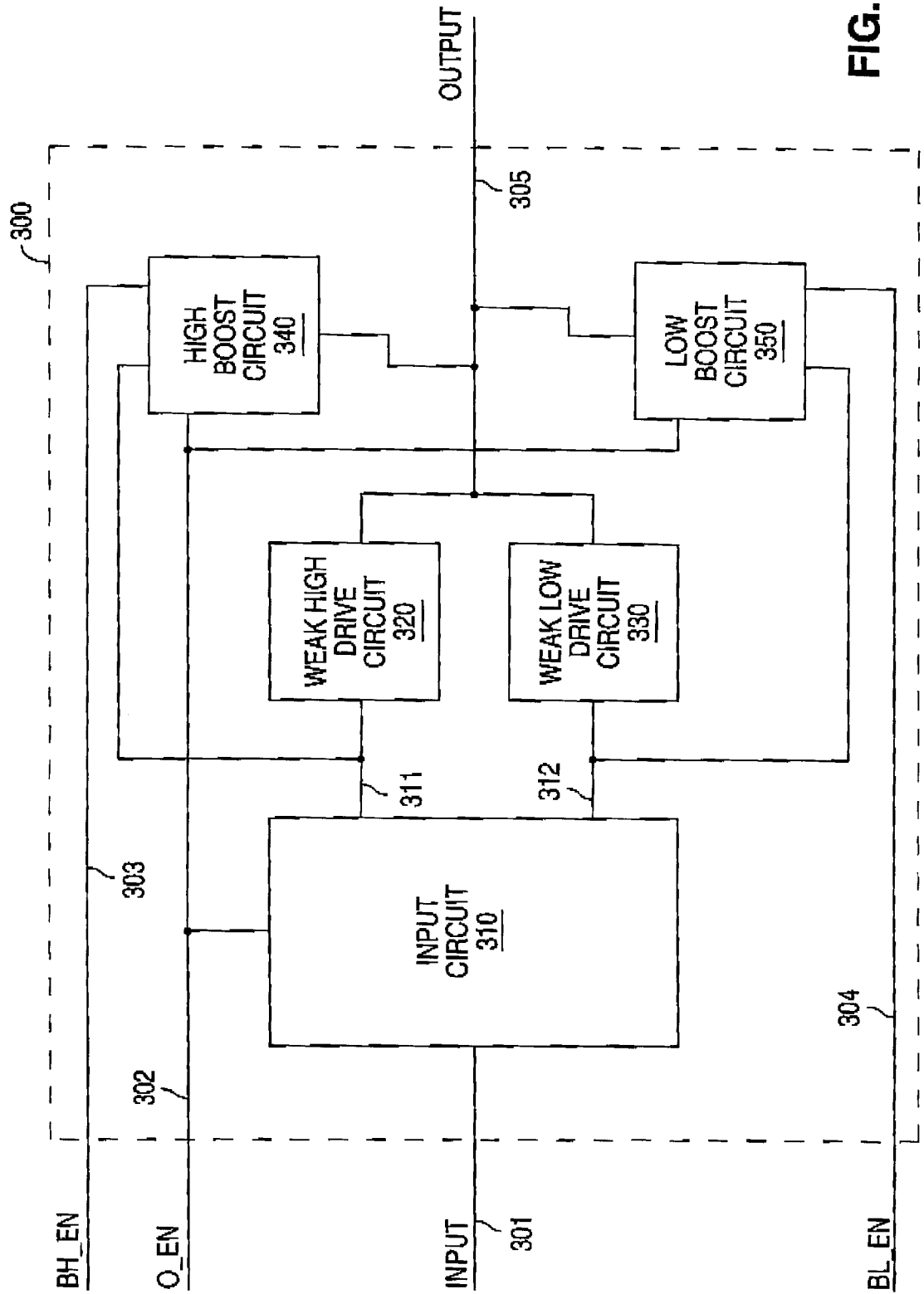
FIG. 3 is a block diagram of a circuit 300, in accordance with one embodiment of the present invention.

FIG. 3 is a block diagram of a non-inverting buffer circuit 300 in one embodiment of the present invention. Buffer circuit 300 receives an input signal INPUT on input terminal 301, and provides an output signal OUTPUT of the same logic state as signal INPUT at terminal 305. An output-enable signal O_EN at terminal 302 provides a high impedance state for output signal OUTPUT at terminal 305. Specifically, when asserted, output signal O_EN allows output signal OUTPUT to be driven either logic high or logic low, as appropriate. Otherwise, output signal OUTPUT is placed into a high impedance state. In buffer circuit 300, while control signal O_EN turns on the primary drive circuits (i.e., drive circuit 320 and 330), control signals BH_EN and BL_EN at terminals 303 and 304 turn on additional drive circuits ("boost circuits") 340 and 350 in circuit 300 for rising and fall edge transitions, respectively, as discussed below. Buffer circuit 300 includes an input circuit 310, which receives input signal INPUT at terminal 301 and provides two output logic control signals at terminals 311 and 312 to drive circuits 320 and 330, respectively.

Figure 4:
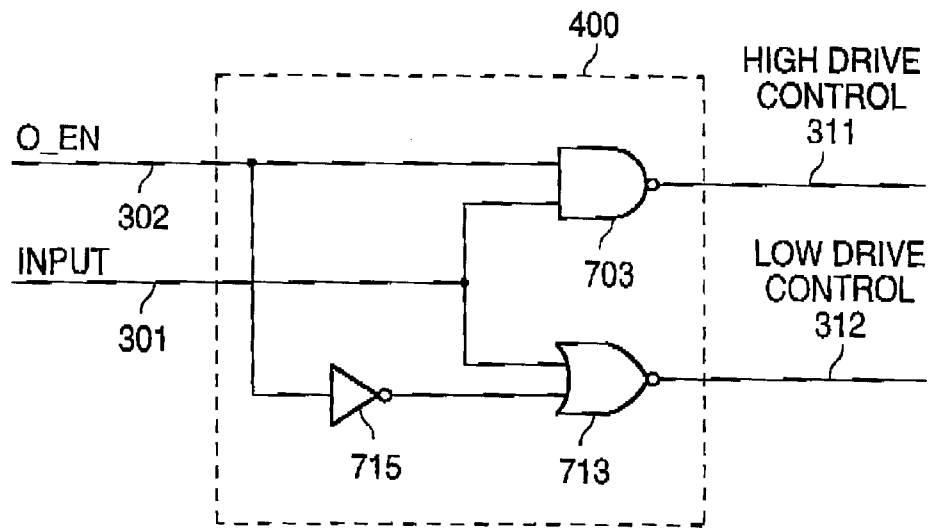
FIG. 4 is a logic diagram of circuit 400, which is one implementation of input circuit 310 of FIG. 3.

An implementation 400 of input circuit 310 is shown in FIG. 4. Circuit 400 includes NAND gate 703, inverter 715, and NOR gate 713. In this embodiment, when signal O_EN is at logic high (asserted), both control signals at terminals 311 and 312 are at the inverted logic state of input signal INPUT. Also, because of the propagation delay through inverter 715, for any transition in input signal INPUT, the control signal at terminal 312 transitions only after the control signal at terminal 311 has transitioned. When output enable signal O_EN is inactive, the control signal at terminal 311 is at logic high and the control signal at terminal 312 is at logic low. The appropriate propagation delay can be affected by the choice of the "threshold" or "trip" voltage at each of the logic gates in input circuit 310.

Figure 5:
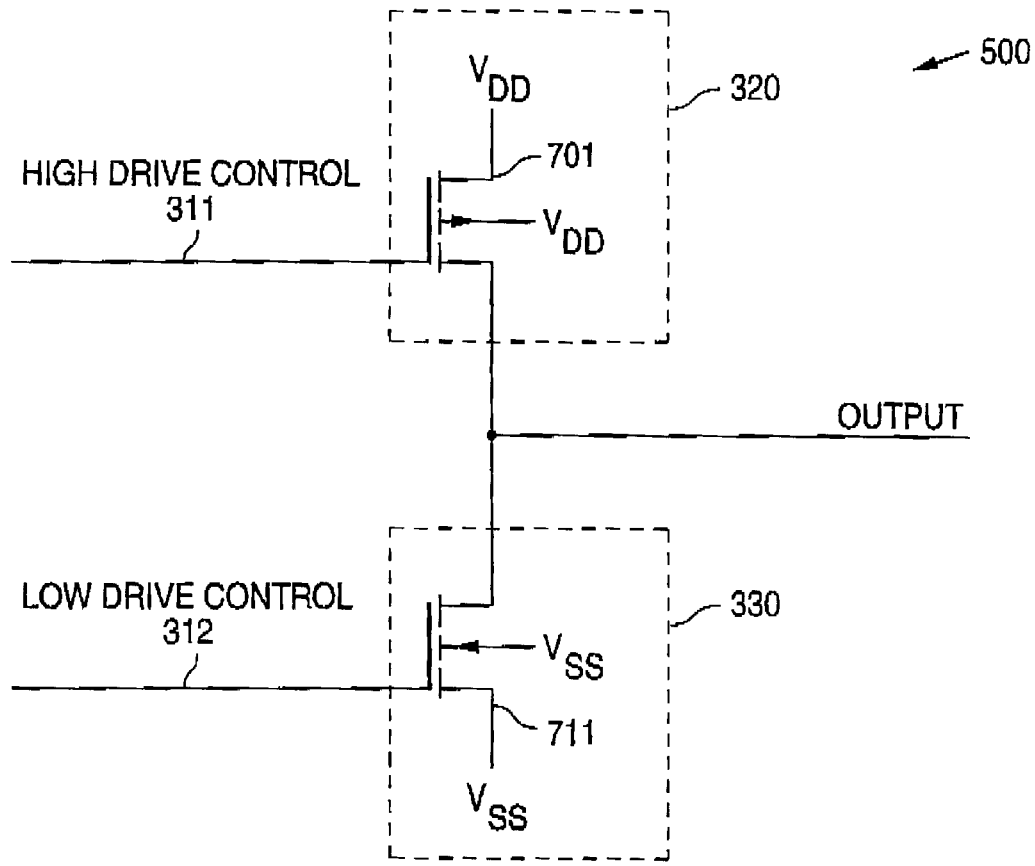
FIG. 5 is a schematic circuit 500 for drive circuits 320 and 330, in accordance with one embodiment of the present invention.

FIG. 5 shows one implementation 500 of primary drive circuits 320 and 330. In circuit 500, primary drive circuit 320 is implemented by a PMOS transistor 701 and primary drive circuit 330 is implemented by a NMOS transistor 711. Thus, if output enable signal O_EN is inactive, primary drive circuits 320 and 330 are both disabled because of the non-conducting or high impedance states of transistors 701 and 711. In the implementation of FIG. 5, if both control signals at terminals 311 and 312 transition simultaneously, there is a brief instance during which both transistors 701 and 711 are conducting, thus constituting a transient "pass-through" current. The magnitude of this pass-through current depends upon the drive strength of transistors 701 and 711. However, in this embodiment, as the control signal at terminal 311 always transitions before the control signal at terminal 312, so that transistor 701 either remains non-conducting or switches on while transistor 711 is non-conducting, such pass-through current is minimized.

Figure 6:
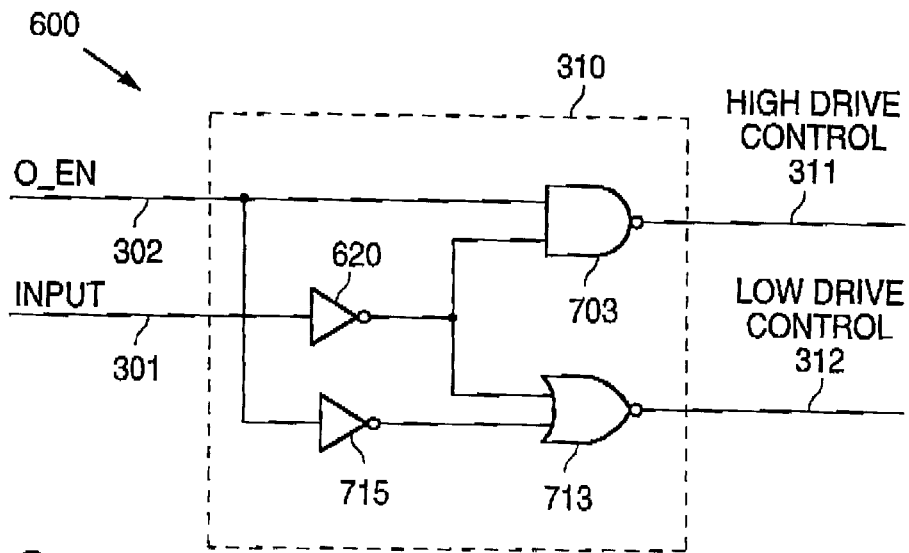
FIG. 6 is a logic diagram of a circuit 600, which is an alternate implementation of the input circuit 310 of FIG. 3.

Implementations 400 and 500 of FIGS. 4 and 5 together provide a "non-inverting" buffer, since the settled logic value of output signal OUTPUT at terminal 305 follows the logic value of input signal INPUT at terminal 301. Another implementation 600 of input circuit 310, shown in FIG. 6, provides an inverting buffer, when used in conjunction with the drive circuits 320 and 330 of FIG. 4. Circuit 600 differs from circuit 400 of FIG. 4 by including inverter 620. The relative delay characteristics of the control signals at terminals 311 and 312 are the same as those of FIG. 4.

Transistors 701 and 711 are sized for a relatively light output load. To accommodate higher output load, buffer circuit 300 includes programmable boost circuits 340 and 350, which are respectively controlled by boost signals BH_EN and BL_EN at terminals 303 and 304, as shown in FIG. 3 above. When signal BH_EN is active, boost circuit 340 increases the drive strength of buffer circuit 300 with respect to logic low to logic high transitions. Similarly, when signal BL_EN is active, boost circuit 350 increases the drive strength of buffer circuit 300 with respect to logic low to logic high transitions.

Figure 7B:
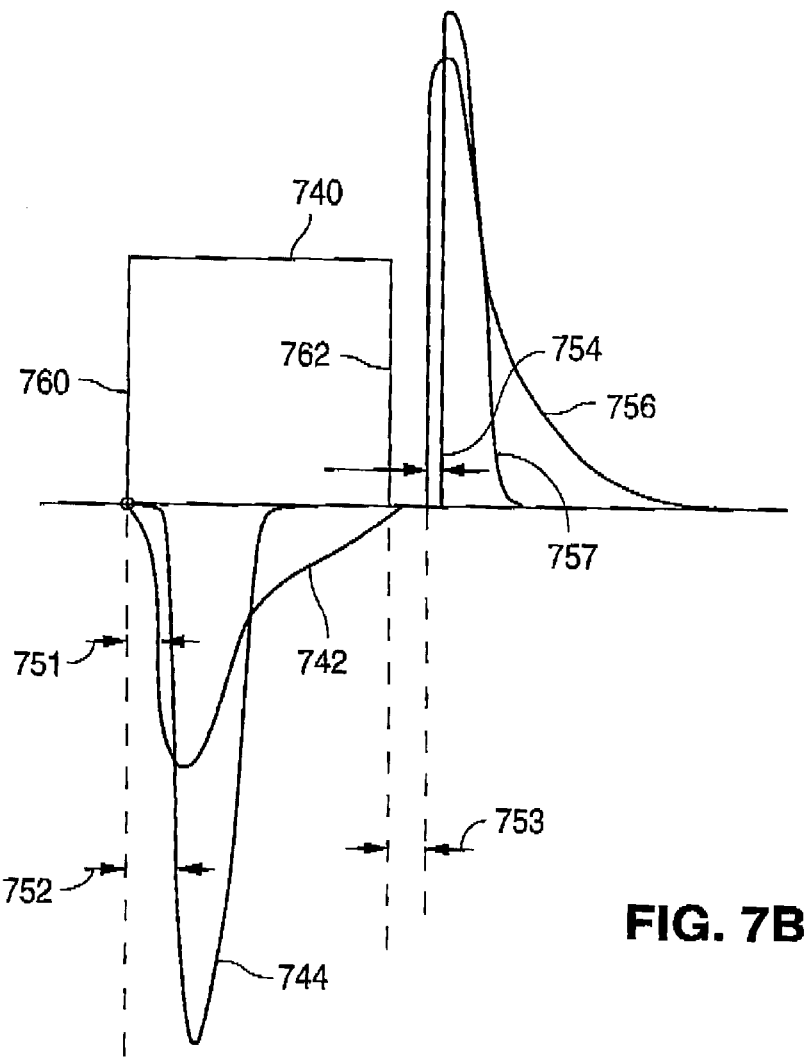
FIG. 7B shows the currents in the primary driver circuits 320 and 330 and boost driver circuits 340 and 350, illustrating the relative timing and delays between an input pulse at input terminal 301 and the corresponding driver currents at output terminal 305.
Figure 7A:
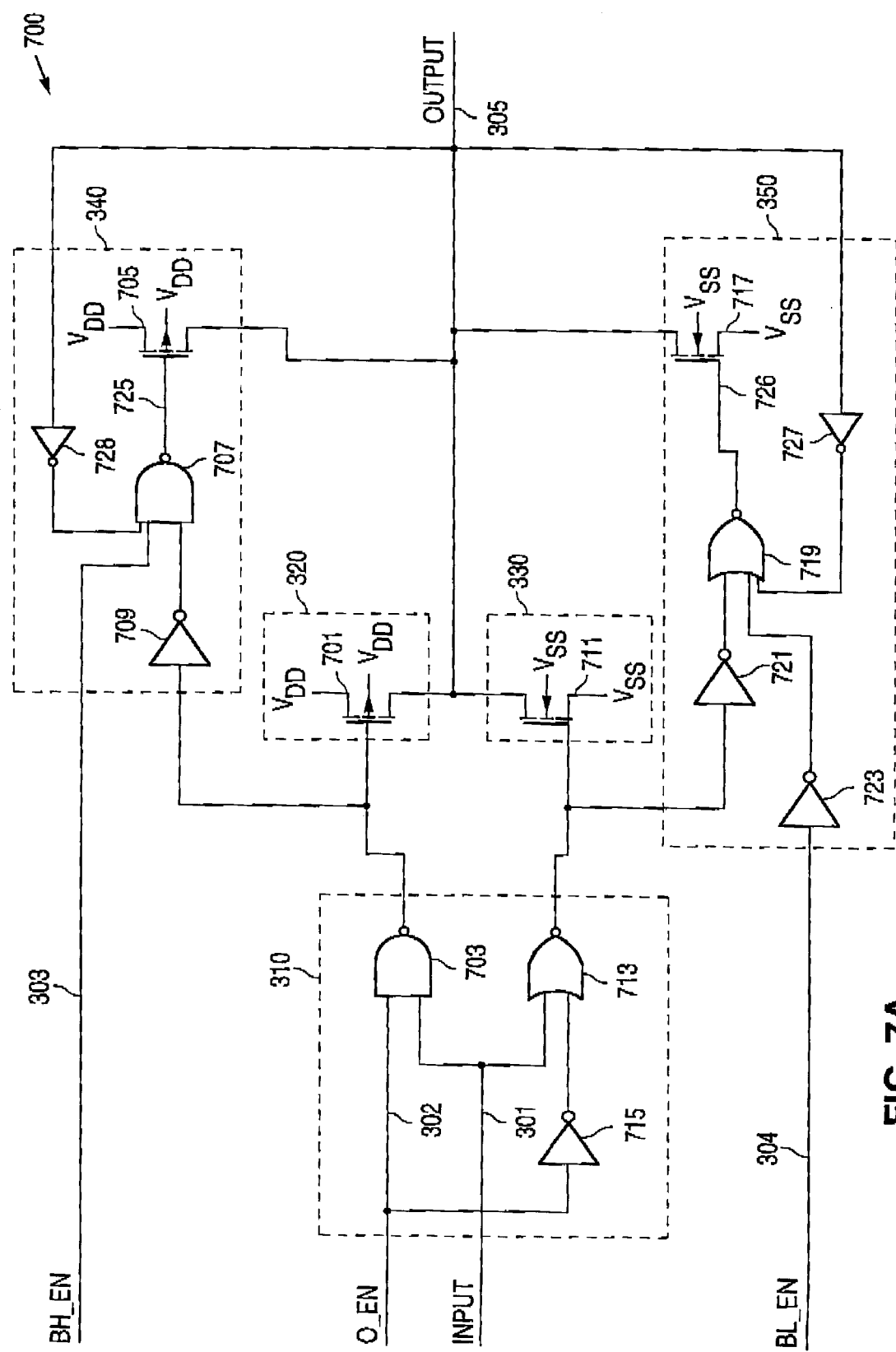
FIG. 7A is a detailed schematic diagram of a circuit 700, which is one implementation of circuit 300 of FIG. 3.

FIG. 7A shows a circuit 700, which is one implementation of buffer circuit 300, including boost circuits 340 and 350. In this implementation of buffer circuit 300, the non-inverting configuration (FIG. 4) of input circuit 310 is selected. In FIG. 7A, boost circuit 340 includes inverters 709 and 728, a 3-input NAND gate 707 and PMOS transistor 705. Boost circuit 340 receives both the boost enable signal BH_EN at terminal 303 and the control signal at terminal 311. When boost enable signal BH_EN is active, the control signal at gate terminal 725 of PMOS transistor 705 has the same logic value as the logic value of the control signal at terminal 311. When the control signal at terminal 725 is at logic low, transistor 705 provides a boost current into the output terminal 305 until it is turned off by inverter 728. The threshold voltages of the transistors in inverter 728 are skewed such that inverter 728's output logic state changes when the voltage at output terminal 305 reaches approximately 800 mV of the supply voltage. When boost control signal BH_EN is inactive, PMOS transistor 705 is non-conducting.

As shown in FIG. 7A, boost circuit 350 includes inverters 721, 723 and 727, 3-input NOR gate 719, and NMOS transistor 717. Boost circuit 350 receives both boost control signal BL_EN at terminal 304 and the control signal at terminal 312. When boost control signal BL_EN is active, the control signal at gate terminal 726 of NMOS transistor 717 has the same logic value as the control signal at terminal 312. When the control signal at terminal 726 is at logic high, transistor 717 sinks a boost current from output terminal 305, until it is turned off by the output voltage of inverter 727. The threshold voltages of the transistors in inverter 727 are skewed such that the output logic state of inverter 727 changes when the voltage at output terminal 305 reaches within 800 mV of ground voltage. When boost control signal BL_EN is inactive, transistor 717 is non-conducting.

In implementation 700 of FIG. 7A, since the respective control signals at gate terminals 725 and 726 of transistors 705 and 717 are both delayed by two logic gates (inverter 709 and NAND gate 707 in boost circuit 340 and inverter 721 and NOR gate 719 in boost circuit 350), the control signals at terminals 725 and 726 generally have the same relative transition delays as the control signals at terminals 311 and 312. Because of inverter 728, transistor 705 switches off prior to transistor 701. Similarly, because of inverter 727, transistor 717 switches before transistors 711. Consequently, during a logic low to logic high transition, because of propagation delay, transistor 705 is turned on after transistor 701, and because of the relative threshold voltages, transistor 705 is turned off before transistor 701.

Similarly, during a logic high to logic low transition, transistor 717 is turned on after transistor 711, and turns off before transistor 711 us turned off. Since transistors 701 and 711 are designed to drive a relatively light load, transistors 701, 705, 711 and 717 together provide a high current at output terminal 305 during an intermediate portion of a logic transition and provide a relatively weaker current at output terminal 305 at the beginning and at the end of the logic transition. With a relatively weaker current at the beginning and at the end of the logic transition (i.e., a softer turn-on and turn-off), noise and ringing at output terminal 305 is minimized. At the same time, since a high current is provided during an intermediate portion of the logic transition, performance at a high output load is not sacrificed. Since booster circuits 340 and 350 can be selectively enabled, using control signals BH_EN and BL_EN respectively, circuit 300 can be programmed for use under a low output load condition (i.e., with boost circuits 340 and 350 disabled), or under a high output load condition (i.e., with booster circuits 340 and 350 enabled).

FIG. 7B shows the currents in transistors 701, 711 and transistors 705 and 717 in response to signal transitions in input signal INPUT at terminal 301. As shown in FIG. 7B, waveform 740, which includes a rising edge 760 and a falling edge 762, represents two logic state transitions of input signal INPUT at terminal 301. In response to rising edge 760, a current represented by waveform 741 begins to flow in transistor 701. After a delay 751, representing the propagation delay from terminal 301 to gate terminal 725 of transistor 705, a current represented by wave form 744 begins to flow in transistor 705. In this embodiment, transistor 705 is selected to be have a higher drive strength than transistor 701, and as mentioned above, transistor 705 turns off before transistor 701 turns off.

Similarly, in response to falling edge 762, a current represented by waveform 756 begins to flow in transistor 711. After a delay 753, representing the propagation delay from terminal 301 to gate terminal 726 of transistor 717, a current represented by wave form 757 begins to flow in transistor 717. Transistor 717 is selected to have a higher drive strength than transistor 711 and is provided a threshold voltage to allow it to turn off prior to transistor 711.

Figure 8:
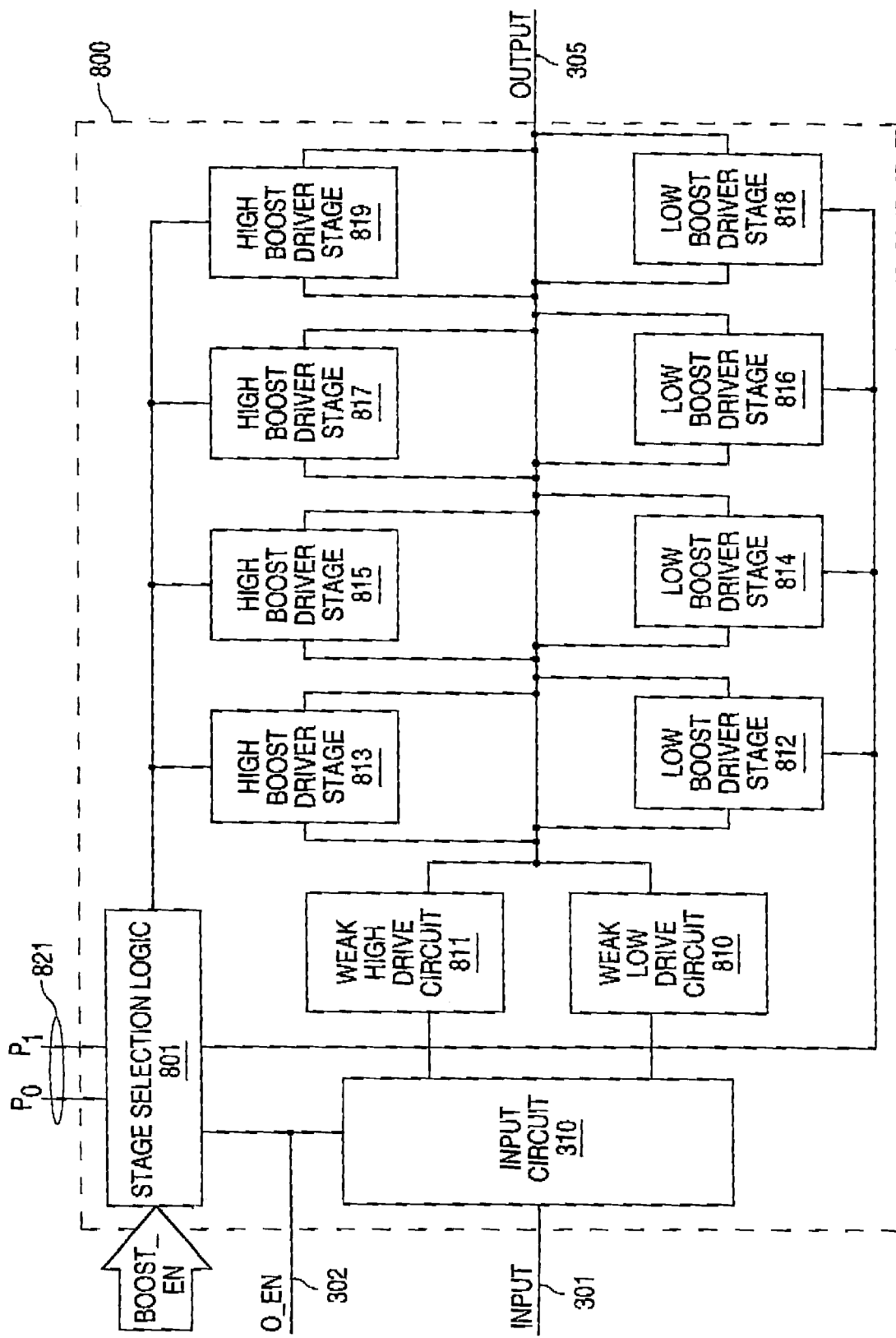
FIG. 8 shows circuit 800, which is an alternative embodiment of the present invention; circuit 800 includes multiple programmably selectable boost stages.

FIG. 8 shows a circuit 800 which is an output buffer of another embodiment of the present invention. Circuit 800 includes input circuit 310, drive circuits 811 and 810, similar to drive circuits 320 and 330 described above, and multiple programmable boost circuits 812–819. Boost circuits 812 and 813, 814 and 815, 816 and 817, and 818 and 819 form boost driver pairs (or "kickers") each providing additional drive strength to output terminal 305, in the manner described above with respect to circuits 340 and 350 above. In this embodiment, each pair of kickers are individually addressable and enabled, so that circuit 800 can be used to boost the drive strength in predetermined steps, thereby allowing customization of circuit 800 to be used under various load conditions (e.g., between 15 pf to 200 pf). Of course, even though only four pairs (high and low) of boost driver stages are shown (i.e., boost circuit 812–819), any number of boost driver stages can be provided within the present invention.

In this multistage embodiment, each boost driver stage 812–819 can be implemented by any of the implementations of boost circuits 340 or 350, discussed above. As shown in FIG. 8, a selection logic circuit, typically implemented by a register, is provided to selective enable each pair of kickers. In this embodiment, each boost circuit pair can be specifically designed such that no two pairs of boost circuit are turned on simultaneously, in accordance with the principles already described above. In one embodiment, two signals (P0 and P1) are provided at terminals 821, and decoded by selection logic circuit 801 to select one of four (4) modes of operation in circuit 800:

| P0 | P1 | Driver circuits enabled |
|----|----|-------------------------|
| 0  | 0  | 810, 811                |
| 1  | 0  | 810, 811                |
|    |    | 814, 815                |
| 0  | 1  | 810, 811                |
|    |    | 812, 813                |
|    |    | 816, 817                |
| 1  | 1  | 810–819                 |

In one implementation, boost circuits 812, 813 are not turned off prior to the primary drive circuits 810 and 811. In this configuration, for a high load drive condition, signal rise and fall are not slowed down due to the weak drive strength of primary drivers 810 and 811. In that implementation, boost circuits 814–819 operate only under AC mode, i.e., their currents are switched off prior to the output voltage at output terminal 305 reaches the rail voltages.

Unlike prior art circuits (e.g., those disclosed in U.S. Pat. No. 4,779,013 to Tanaka), circuit 800 allows application-specific and dynamic programming of the drive strength of the buffer. By selectively enabling any one of the various boost circuit combinations, one can configure circuit 800 to achieve any one of several output power levels, timing relationships, or noise immunity profiles.

The above detailed description is provided to illustrate the specific embodiments of the present invention and is not intended to be limiting. Numerous variations and modifications within the scope of the present invention are possible. The present invention is set forth in the appended claims.

We claim:

1. A programmable output buffer circuit comprising:

an input circuit for receiving an input signal, an output enable signal, and for providing first and second data signals each being representative of said input signal;

an output terminal for an output signal;

a primary driver circuit, receiving an output enable signal and said first and second data signals, said primary driver circuit including a first driver circuit coupled to said output terminal for driving, in response to said output enable signal and said first data signal, said output terminal to a first reference voltage, and a second driver circuit coupled to said output terminal for driving, in response to said output enable signal and said second data signal, said output terminal to a second reference voltage; and a boost driver circuit, programmably activated by a selection signal, receiving a boost enable signal and said first and second data signals, said boost enable signal being independent of said output enable signal, and including a first driver circuit coupled to said output terminal for driving, in response to said boost enable signal and said first data signal, said output terminal towards said first reference voltage, and a second driver circuit coupled to said output terminal for driving, in response to said boost enable signal and said second data signal, said output terminal to said second reference voltage.

2. A programmable buffer circuit as in claim 1, wherein said boost driver circuit is activated subsequent to activation said primary driver circuit and deactivated prior to said output signal reaching either said first reference voltage or said second reference voltage.

3. A programmable output buffer circuit as in claim 1, wherein, in response to a transition in said input signal, said first data signal and said second data signal transition after a delay relative to each other.

4. A programmable output buffer circuit as in claim 1, further comprising a second boost driver circuit including circuit receiving a second boost enable signal and said first and second data signals and including a third driver circuit coupled to said output terminal for driving, in response to said second boost enable signal and said first data signal, said output terminal towards said first reference voltage, and a second driver circuit coupled to said output terminal for driving, in response to said second boost enable signal and said second data signal, said output terminal towards said second reference voltage.

5. A programmable output buffer as in claim 4, wherein said third driver circuit is turned on after said first driver circuit is turned on.

6. A programmable output buffer as in claim 4, wherein said first and second boost enable signals are provided by a selection circuit.

7. A programmable output buffer as in claim 6, wherein said selection circuit comprises a register.

8. A programmable output buffer as in claim 4, wherein said second boost driver circuit remains activated while said primary driver circuit is activated.

9. A programmable output buffer as in claim 1 wherein said input signal and said first and second data signals have the same logic state.

10. A programmable output buffer as in claim 1, wherein said input signal has opposite logic state as each of said first and second data signals.

11. A programmable output buffer as in claim 4, wherein said second boost circuit operates in an AC mode.

12. A programmable output buffer as in claim 1, wherein said boost enable signal is activated programmably.

13. A programmable output buffer as in claim 1, wherein said boost driver circuit has a drive strength greater than the drive strength of said primary driver circuit.

* * * * *